(12) United States Patent
Selvamanickam et al.

(10) Patent No.: US 6,908,362 B2
(45) Date of Patent: Jun. 21, 2005

(54) REEL-TO-REEL SUBSTRATE TAPE POLISHING SYSTEM

(75) Inventors: Venkat Selvamanickam, Wynantskill, NY (US); Michael T. Gardner, Troy, NY (US); Raymond D. Judd, Schenectady, NY (US); Martin Weloth, Esperance, NY (US); Yunfei Qiao, Schenectady, NY (US)

(73) Assignee: SuperPower, Inc, Schenectady, NY (US)

( * ) Notice: Subject to any disclaimer, the term of this patent is extended or adjusted under 35 U.S.C. 154(b) by 0 days.

(21) Appl. No.: 10/469,071

(22) PCT Filed: Mar. 4, 2002

(86) PCT No.: PCT/US02/06270

§ 371 (c)(1),
(2), (4) Date: Mar. 2, 2004

(87) PCT Pub. No.: WO02/070194

PCT Pub. Date: Sep. 12, 2002

(65) Prior Publication Data

US 2004/0132382 A1 Jul. 8, 2004

Related U.S. Application Data

(60) Provisional application No. 60/273,195, filed on Mar. 2, 2001.

(51) Int. Cl.[7] ................................................ B24B 7/13
(52) U.S. Cl. ........................... 451/28; 451/57; 451/176
(58) Field of Search .................................. 451/176, 105, 451/107, 109, 110, 28, 57, 59

(56) References Cited

U.S. PATENT DOCUMENTS

| 2,621,445 | A | * | 12/1952 | Wallace ....................... 451/65 |
| 2,680,938 | A | * | 6/1954 | Peterson ...................... 451/67 |
| 4,254,585 | A | * | 3/1981 | Schoettle et al. ............. 451/55 |
| 4,674,238 | A |   | 6/1987 | Suzuki et al. |
| 4,983,421 | A | * | 1/1991 | Mochizuki et al. ......... 427/130 |
| 5,361,548 | A |   | 11/1994 | Kuehn |
| 5,810,642 | A |   | 9/1998 | Bando |
| 5,997,388 | A |   | 12/1999 | Canella et al. |
| 6,113,753 | A | * | 9/2000 | Washburn ............... 204/192.15 |
| 6,220,943 | B1 |  | 4/2001 | Wang et al. |
| 6,322,426 | B1 |  | 11/2001 | Akagi et al. |

* cited by examiner

*Primary Examiner*—Robert A. Rose
(74) *Attorney, Agent, or Firm*—Katten Muchin Zavis Rosenman

(57) ABSTRACT

Disclosed is a reel-to-reel single-pass mechanical polishing system (100) suitable for polishing long lengths of metal substrate tape (124) used in the manufacture of high-temperature superconductor (HTS) coated tape, including multiple instantiations of a polishing station (114) in combination with a subsequent rinsing station (116) arranged along the axis of the metal substrate tape (124) that is translating between a payout spool (110a) and a take-up spool (110b). The metal substrate tape obtains a surface smoothness that is suitable for the subsequent deposition of a buffer layer.

16 Claims, 11 Drawing Sheets

REEL-TO-REEL SUBSTRATE TAPE POLISHING SYSTEM

CROSS REFERENCE TO RELATED APPLICATION

This application claims priority from provisional application U.S. Ser. No. 60/273,195 filed Mar. 2, 2001.

FEDERALLY SPONSORED RESEARCH OR DEVELOPMENT

This invention was conceived while working under a government contract with the New York State Energy Research and Development Agency under reference 4466L-IABR-IA99.

FIELD OF THE INVENTION

The present invention relates to the field of mechanical polishing. More particularly, the present invention relates to a system for mechanical polishing of long lengths of translating metal substrate tape used in the manufacture of high-temperature superconductor (HTS) tape.

BACKGROUND OF THE INVENTION

Wire forms the basic building block of the world's electric power system, including transformers, transmission and distribution systems, and motors. The discovery of revolutionary HTS compounds in 1986 led to the development of a radically new type of wire for the power industry; this discovery is the most fundamental advance in wire technology in more than a century. However, to date only short samples of the HTS-coated tape used in the manufacture of next-generation HTS wires have been fabricated at high performance levels. In order for HTS technology to become commercially viable for use in the power generation and distribution industry, it will be necessary to develop techniques for continuous, high-throughput production of HTS-coated tape.

A typical HTS tape is a 3-layer laminate of a support layer, a buffer layer and a HTS film. The support layer is typically composed of stainless steel or nickel and provides structural integrity and flexibility to the tape. The buffer layer buffer layer is disposed between the metal substrate and the HTS film to prevent reaction between the substrate and the HTS film and, importantly, acts as a template for epitaxial growth of the HTS film. Typical buffers are yttrium-stabilized zirconia (YSZ) or cerium oxide ($CeO_2$). The HTS film is formed of, for example, yttrium-barium-copper-oxide (YBCO).

Presently, substrates are polished by well-known mechanical, chemical, or electrical means to achieve a high degree of planarity or surface smoothness. Planarity is important in the manufacture of integrated circuits and numerous processes have been developed to meet the requirement of achieving a high degree of surface smoothness in the silicon wafer substrates used in manufacturing such electronic components.

One type of polishing process, mechanical polishing, holds a stationary substrate on a rotating pad and presses it against a conformable rotating polishing pad. Mechanical polishing may be performed in conjunction with a chemically active abrasive solvent slurry, a process commonly referred to a chemical mechanical polishing, which provides a higher material removal rate.

The abrasive slurry is typically comprised of small very hard particles such as diamond or boron oxide. The size of the particles used and other parameters, such as rotation speed, duration and contact force determine the removal rate and eventual roughness of the substrate.

In order to achieve high current densities in the HTS film, one of the main requirements is that the substrate be very smooth, with minimal surface imperfections. When the coatings are in form of thin films (up to 10 microns), the surface quality of the substrate becomes critical. Defects in the surface of the metal substrate can lead to voids, delamination, undesired texture, and roughness in the coatings. Furthermore, these imperfections or roughness on the substrate surface can be transmitted through the intermediate buffer layer and lead to a defect in the HTS film, which in an HTS-coated tape application must have a high degree of planarity, with minimal surface imperfections over long lengths.

A number of surface polishing techniques are known to the art. One such polishing technique is described in Kubo, U.S. Pat. No. 5,938,502, dated Aug. 17, 1999 and entitled "Polishing Method Of Substrate And Polishing Device Therefor". Kubo describes a method employing a polishing pad and a slurry. The polishing device includes a bed formed with a polishing pad on the surface and driven for rotation, a rotatable carrier for holding the substrate to be polished, and a slurry supply means for supplying a slurry as an abrasive to the surface of the polishing pad. The substrate is polished by the abrasive slurry and the polishing pad, while pressing the substrate held by the carrier onto the polishing pad. Kubo's polishing technique may require several passes to achieve the smoothness required for an HTS-coated tape application.

Kubo's technique however, is applicable only to stationary substrates and is not suitable for the polishing of long lengths of continuously translating substrate tape. Furthermore, in the manufacturing of HTS-coated tape it is preferable to complete the surface preparation of the substrate in one pass so as to increase throughput and reduce cost. Thus, another drawback of Kubo's polishing technique is that it requires several passes and is therefore not suitable to a process for polishing long lengths of continuously translating substrate tape.

Shendon, U.S. Pat. No. 6,336,851, dated Jan. 8, 2002 and entitled "Substrate Belt Polisher," describes a flexible membrane-polishing belt against which a substrate for a semiconductor wafer is polished using chemical mechanical polishing principles. A fluidized layer is provided on a surface of a polishing member backing assembly, which urges the moving polishing membrane toward the substrate held in a polishing head. The linear motion of the belt provides uniform polishing across the full width of the belt and provides the opportunity for a chemical mechanical polishing to take place. Several configurations are disclosed. They include belts which are wider than the substrate being polished, belts which cross the substrate being polished, but which provide relative motion between the substrate and the polishing belt, and polishing belt carriers having localized polishing areas which are smaller than the total area of the substrate to be polished. Only a small area on the surface of the substrate is in contact with polishing membrane but the motion of the carrier with respect to the substrate is programmed to provide uniform polishing of the full substrate surface, as is each configuration described.

Jackson et al., U.S. Pat. No. 6,241,591, dated Jun. 5, 2001, and entitled "Apparatus And Method For Polishing A Substrate," describes a polishing apparatus. Uniform pressure distribution allows a semiconductor substrate polished with the polishing apparatus to have reduced edge exclusion, and thus increased die yield.

Nagahara et al., U.S. Pat. No. 6,179,690, dated Jan. 30, 2001, entitled "Substrate Polishing Apparatus," describes a chemical mechanical polishing apparatus that includes a rotating plate on which a substrate is received, and a polishing pad, which moves across the substrate as it rotates on the plate to polish the substrate. The load of the pad against the substrate, and the rotary speed of the plate, may be varied to control the rate of material removed by the pad.

Sarfaty et al., U.S. Pat. No. 5,741,171, dated Apr. 21, 1998 and entitled "Precision Polishing System," describes a polishing system able to polish samples to accuracy within the sub micron range. The polishing system has applications in the semiconductor field for use in polishing silicon wafers during testing and quality control inspections.

However, none of these prior art polishing systems are capable of solving the problem existing during the manufacture of HTS tape, viz. how to polish a continuously moving length of material in a single pass.

It is an object of this invention to provide a polishing system amendable to continuous production of HTS tape in a one-pass operation.

It is therefore an object of the invention to provide a system and method for surface preparation of long lengths of metal substrates in a continuous manner.

It is another object of the invention to provide a polishing system and method for producing a surface roughness of the substrate that is of very high quality, suitable to achieve high current densities in long lengths of superconducting tapes, in a single polishing pass.

SUMMARY

The polishing system of the present invention is a reel-to-reel single-pass continuous mechanical polishing system suitable for polishing long lengths of metal substrate tape used in the manufacture of HTS-coated tape. The polishing system of the present invention includes multiple instantiations of a surface treatment unit, each comprising a polishing station in combination with a subsequent rinsing station arranged along the axis of a metal substrate tape that is continuously translating between a payout spool and a take-up spool. By translating through the multiple instantiations of a polishing station in combination with a subsequent rinsing station, the metal substrate tape experiences a series of polishing and cleaning events to progressively diminish its surface roughness and achieve a surface smoothness that is acceptable for depositing a buffer layer for use in the manufacture of HTS-coated tape.

More specifically, disposed within each polishing station are multiple polishing wheels upon which is dispensed a polishing medium, such as a slurry formed by mixing an abrasive material and water. Within each polishing station one surface of the translating metal substrate tape is in contact under pressure with the polishing wheels and polishing medium. As the HTS tape translates through the polishing operation, the surface imperfections are gradually removed by varying the parameters of the process, such as size and hardness of the abrasive.

The hardness of the polishing wheels disposed within the successive polishing stations typically varies from very hard to hard to soft as the relative position of the polishing stations progress along the line from the front end of the polishing system (the payout spool) to the back end of the polishing system (the take-up spool). The particle size of the polishing medium used in the successive polishing stations ranges, for example, from 1.0 to 0.3 to 0.05 microns as the relative position of the polishing stations progress along the line from the front end of the polishing system to the back end of the system. In this way, the metal substrate tape experiences, via progressive stages, rougher to finer polishing events, each in combination with a respective rinsing event, as it translates through the polishing system, thereby achieving in a single pass through the polishing system a surface smoothness that is suitable for the subsequent deposition of a buffer layer.

The translation of the metal substrate tape through the polishing system is accomplished via a tape feeder assembly that is driven by a stepper motor for providing a controlled rate of translation to allow the proper exposure time of the metal substrate tape to the polishing and cleaning events. The tape feeder assembly operates in combination with the payout spool and the take-up spool that are each driven by a torque motor for controlling the tension of the metal substrate tape as it translates through the polishing system of the present invention.

Lastly, the polishing system of the present invention includes an optical surface roughness measurement gage at the back end of the polishing system for monitoring the finished surface quality of the metal substrate tape.

DETAILED DESCRIPTION OF THE INVENTION

Figure 1:
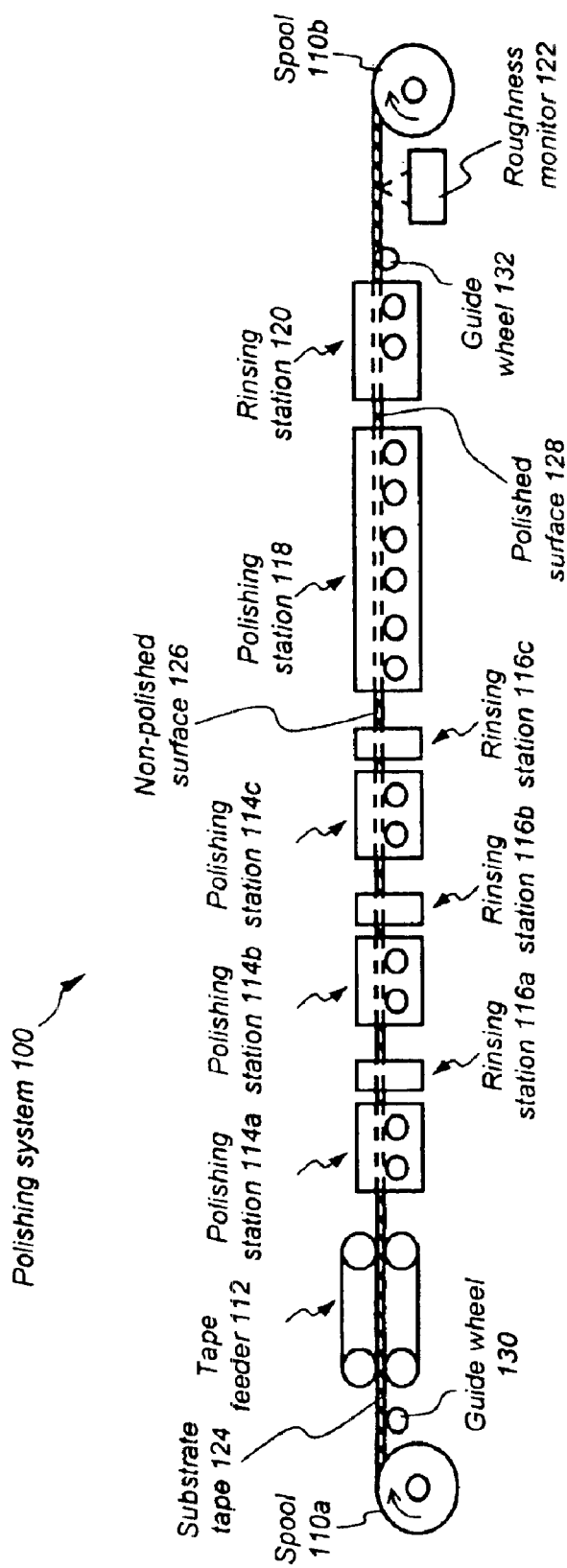
FIG. 1 illustrates a high-level diagram of a polishing system of the present invention suitable for polishing long lengths of metal substrate tape used in the manufacture of HTS-coated tape.

FIG. 1 illustrates a polishing system 100 in accordance with the invention. The polishing system 100 of the present invention is a mechanical polishing system suitable for polishing long lengths of metal substrate tape used in the manufacture of HTS-coated tape.

The polishing system 100 includes multiple instantiations of a spool 110 (i.e., a spool 110a and a spool 110b). The spool 110a serves as a payout spool located at the entry point of the polishing system 100. Upon the spool 110a is wound a length of substrate tape 124 that is formed of metals, such as stainless steel or a nickel alloy such as Inconel. The substrate tape 124 has a non-polished surface 126 and a polished surface 128. The substrate tape 124 is capable of withstanding high temperatures and vacuum conditions, and is typically between 3 mm and 1 cm in width and upwards of several hundred meters in length. The substrate tape 124 typically has several meters of "leader" at both ends to aid in handling. The substrate tape 124 is laced through the polishing system 100 from the spool 110a and wound onto the spool 110b that serves as a take-up spool at the exit point of the polishing system 100. Each spool 110 is driven by a torque motor and is described in detail in FIGS. 2A and 2B.

The polishing system 100 further includes a tape feeder 112 that is a set of motor-driven belts that serve as the driving mechanism for translating the substrate tape 124 through the polishing system 100. The tape feeder 112 also guides the substrate tape 124 from the spool 110a into a first instantiation of a polishing station 114. The tape feeder 112 is described in detail in FIGS. 3A and 3B.

The polishing system 100 further includes multiple instantiations of a polishing station 114, for example, a polishing station 114a, a polishing station 114b, and a polishing station 114a; where each polishing station 114 includes a stainless steel tank containing a set of polishing wheels that contact the substrate tape 124 in combination with a polishing medium, such as aluminum oxide. Furthermore, each polishing wheel within the polishing station 114 has an associated pressure device for applying pressure upon the substrate tape 124 against the respective polishing wheel. The polishing station 114 is described in detail in FIGS. 4A, 4B, and 4C. The pressure device is described in detail in FIG. 5.

The polishing system 100 further includes multiple instantiations of a rinsing station 116, for example, a rinsing station 116a, a rinsing station 116b, and a rinsing station 116c; where each rinsing station 116 includes a stainless steel tank containing a sprayer assembly for applying de-ionized water or standard tap water to the substrate tape 124 for rinsing the polishing medium from the substrate tape 124. The rinsing station 116 is described in detail in FIGS. 6A and 6B.

The polishing system 100 further includes a polishing station 118 that serves as a final polishing station; where the polishing station 118 includes a stainless steel tank containing multiple sets of polishing wheels that contact the substrate tape 124 in combination with a polishing medium, such as aluminum oxide. Furthermore, each polishing wheel within the polishing station 118 has an associated pressure device for applying pressure upon the substrate tape 124 against the respective polishing wheel. The polishing station 118 is described in detail in FIG. 7.

The polishing system 100 further includes a rinsing station 120 that serves as a final rinsing station; where the rinsing station 120 includes a stainless steel tank containing multiple sprayer assemblies for applying de-ionized water or standard tap water to the substrate tape 124 for rinsing the polishing medium from the substrate tape 124. Furthermore, the rinsing station 120 includes a set of soft polishing wheels for removing the last remaining residue of the polishing medium. The rinsing station 120 is described in detail in FIGS. 8A and 8B.

With continuing reference to FIG. 1, all elements of the polishing system 100 are arranged in a line along the axis of the substrate tape 124 formed between the spool 110a and the spool 110b. More specifically, the substrate tape 124 is unwound from the spool 110a and is laced through the tape feeder 112, then subsequently through the first polishing station 114 (i.e., polishing station 114a), then subsequently through the first rinsing station 116 (i.e., rinsing station 116a), then subsequently through the second polishing station 114 (i.e., polishing station 114b), then subsequently through the second rinsing station 116 (i.e., rinsing station 116b), then subsequently through the third polishing station 114 (i.e., polishing station 114c), then subsequently through the third rinsing station 116 (i.e., rinsing station 116c), then subsequently through the polishing station 118, then lastly through the rinsing station 120 and onto the spool 110b.

Disposed between the spool 110a and the tape feeder 112 is a guide wheel 130. Likewise, disposed between the rinsing station 120 and the spool 110b is a guide wheel 132. The guide wheels 130 and 132 are in contact with the polished surface 128 of the substrate tape 124 and assist in supporting and guiding the substrate tape 124 as it translates along the polishing system 100. The guide wheels 130 and 132 are formed of a material that is not damaging to the polished surface 128 of the substrate tape 124, such materials include Teflon or soft rubber.

Lastly, and optionally, the polishing system 100 includes a roughness monitor 122 disposed between the guide wheel 132 and the spool 110b and directed at the polished surface 128 of the substrate tape 124. The roughness monitor 122 is mounted on a 3-axis adjustable stage (not shown), such that its position relative to the polished surface 128 of the substrate tape 124 may be adjusted. The distance between the substrate tape 124 and the roughness monitor 122 is set appropriately for measuring roughness to the required accuracy. The roughness monitor 122 provides a quality check mechanism at the exit point of the polishing system 100. The roughness monitor 122 is an optical surface roughness measurement gage, such a LASER$^{CHECK}$ device manufactured by Optical Dimensions LLC, which is designed to measure the surface roughness over which it passes. In the case of the polishing system 100 of the present invention, the roughness monitor 122 provides an average surface roughness of the polished surface 128 of the substrate tape 124.

Figure 2A:
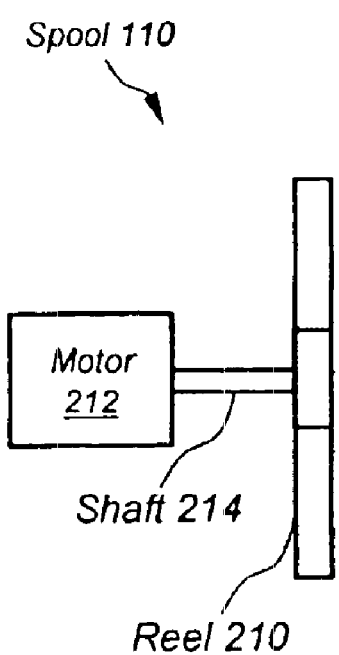
FIGS. 2A and 2B illustrate a side view and a front view, respectively, of a spool suitable for use as the payout and take-up spool within the polishing system of the present invention.
Figure 2B:
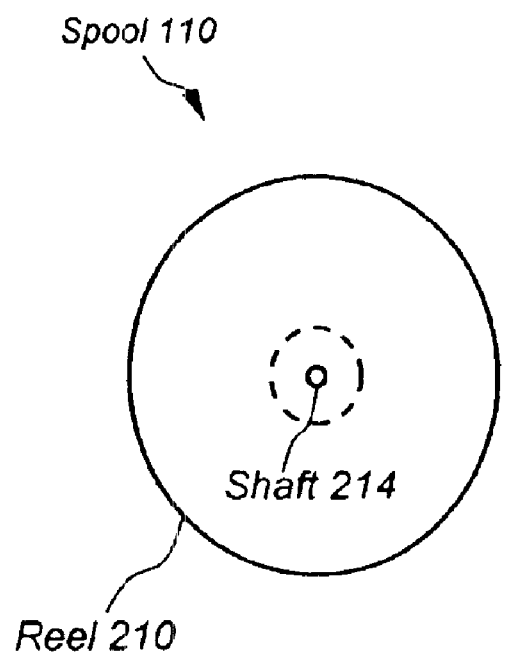

FIGS. 2A and 2B illustrate a side view and a front view, respectively, of the spool 110 that is suitable for use as the payout spool (i.e., the spool 110a) and take-up spool (i.e., the spool 110b) of the polishing system 100 of the present invention. The spool 110 includes a reel 210 mechanically connected to a motor 212 via a rotatable shaft 214. The reel 210 is a reel upon which the substrate tape 124 is wound. The diameter and width of the reel 210 may vary depending on the dimensions of the substrate tape 124. The motor 212 is a conventional torque motor, such as an Oriental Motor 5TK20GN. When installed the torque exerted by the spool 110a is opposite the torque exerted by the spool 110b to provide the proper tension on the substrate tape 124 as it unwinds from the spool 110a and translates through the polishing system 100 and subsequently winds onto the spool 110b.

Figure 3A:
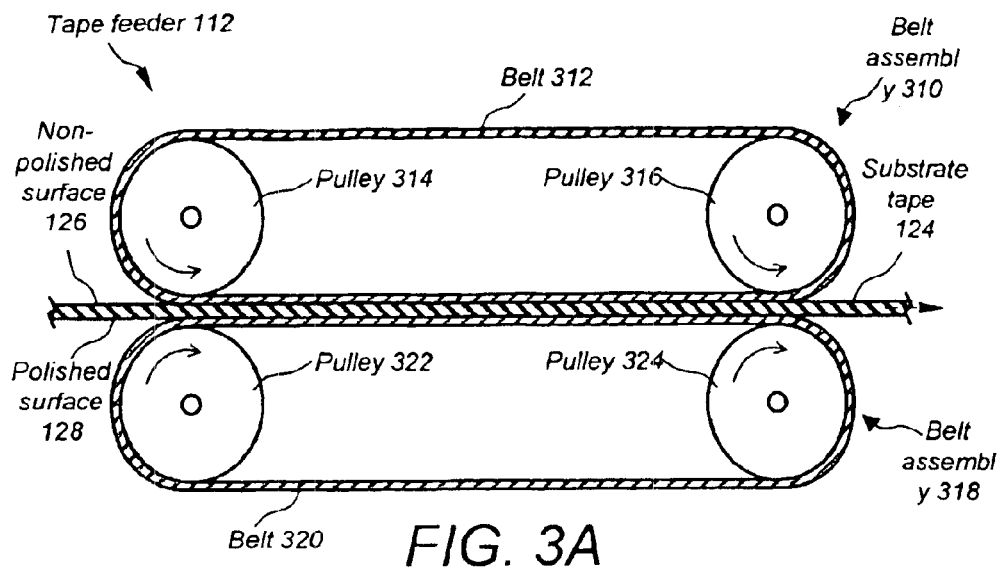
FIGS. 3A, 3B, and 3C illustrate a side view, a top view, and an end view, respectively, of a substrate tape drive mechanism suitable for use as the tape feeder apparatus within the polishing system of the present invention.
Figure 3B:
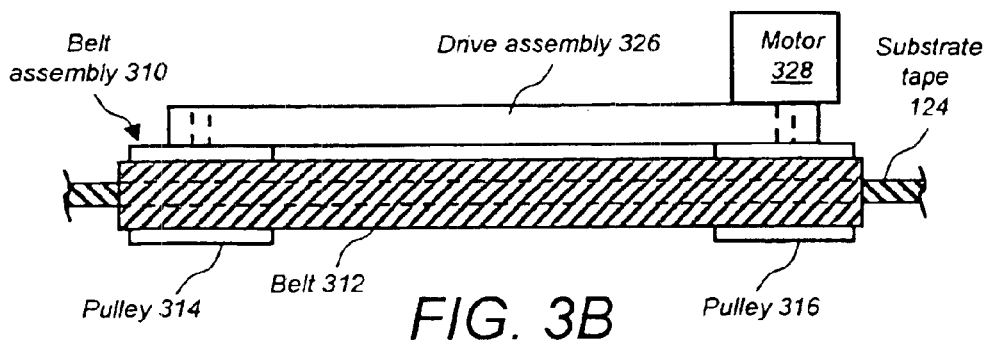
Figure 3C:
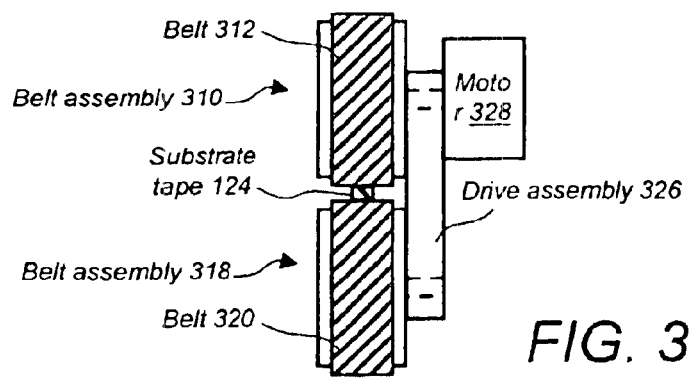

FIGS. 3A, 3B, and 3C illustrate a side view, a top view, and an end view, respectively, of the tape feeder 112. The tape feeder 112 is a substrate tape drive mechanism suitable for use as the tape feeder apparatus within the polishing system 100 of the present invention. The tape feeder 112 provides a controlled rate of translation to allow the proper exposure time of the substrate tape 124 to the polishing and cleaning events that take place within the polishing system 100.

With reference to FIG. 3A, the tape feeder 112 includes a belt assembly 310 that further includes a belt 312 forming a loop around a conventional pulley 314 and a conventional pulley 316. Additionally, the tape feeder 112 includes a belt assembly 318 that further includes a belt 320 forming a loop around a conventional pulley 322 and a conventional pulley 324. Such that the belt assembly 310 and the belt assembly 318 are arranged in parallel with one another in a stacked fashion such that the outer surface of the belt 312 is facing the outer surface of the belt 320, as shown in FIGS. 3A and 3C.

With reference to FIGS. 3A, 3B, and 3C, the belt assembly 310 and the belt assembly 318 are mechanically coupled via a mechanical drive assembly 326 and rotatably driven by a motor 328 that is a conventional stepper motor, such as an Oriental M540-401-115 motor. The drive assembly 326 is designed using various belts, pulleys and gears (not shown) in a conventional manner such that in operation the belt assembly 310 rotates in a direction opposite the belt assembly 318. For example, if the pulleys 314 and 316 of the belt assembly 310 are rotating counter-clockwise, then the pulleys 322 and 324 of the belt assembly 318 are rotating clockwise.

In operation, as the substrate tape 124 is fed through the tape feeder 112, the outer surface of the belt 312 of the belt assembly 310 is in contact with the non-polished surface 126 of the substrate tape 124 and the outer surface of the belt 320 of the belt assembly 318 is in contact with the polished surface 128 of the substrate tape 124, as shown in FIGS. 3A and 3C. As a result, the spacing between the belt assembly 310 and the belt assembly 318 is dependent upon the thickness of the substrate tape 124. The pressure exerted on the substrate tape 124 by the belt 312 and the belt 320 creates sufficient friction to cause the substrate tape 124 to translate through the tape feeder 112 due to the rotation of the belt 312 and the belt 320.

Figure 4A:
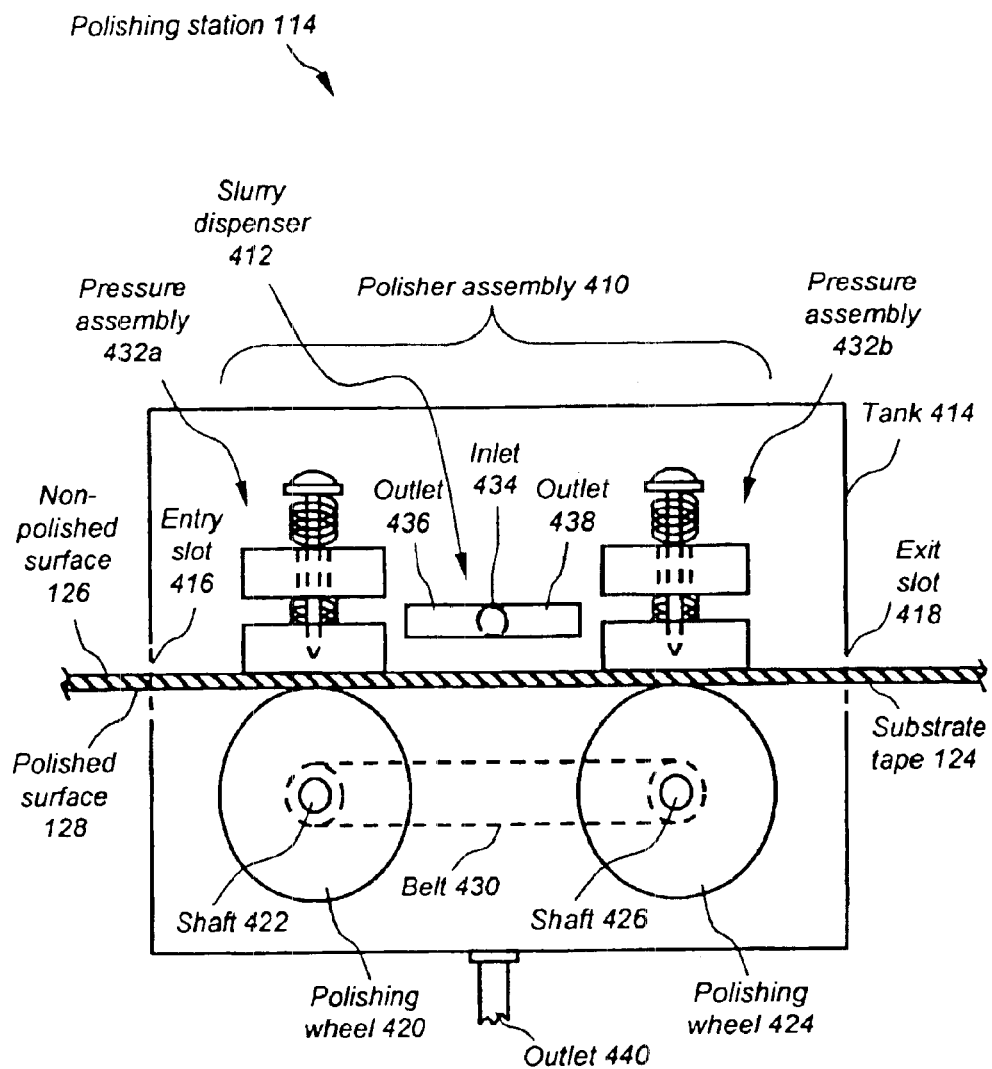
FIGS. 4A, 4B and 4C illustrate a side view, a top view, and an end view, respectively, of a mechanical polisher suitable for use as a polishing station within the polishing system of the present invention.
Figure 4B:
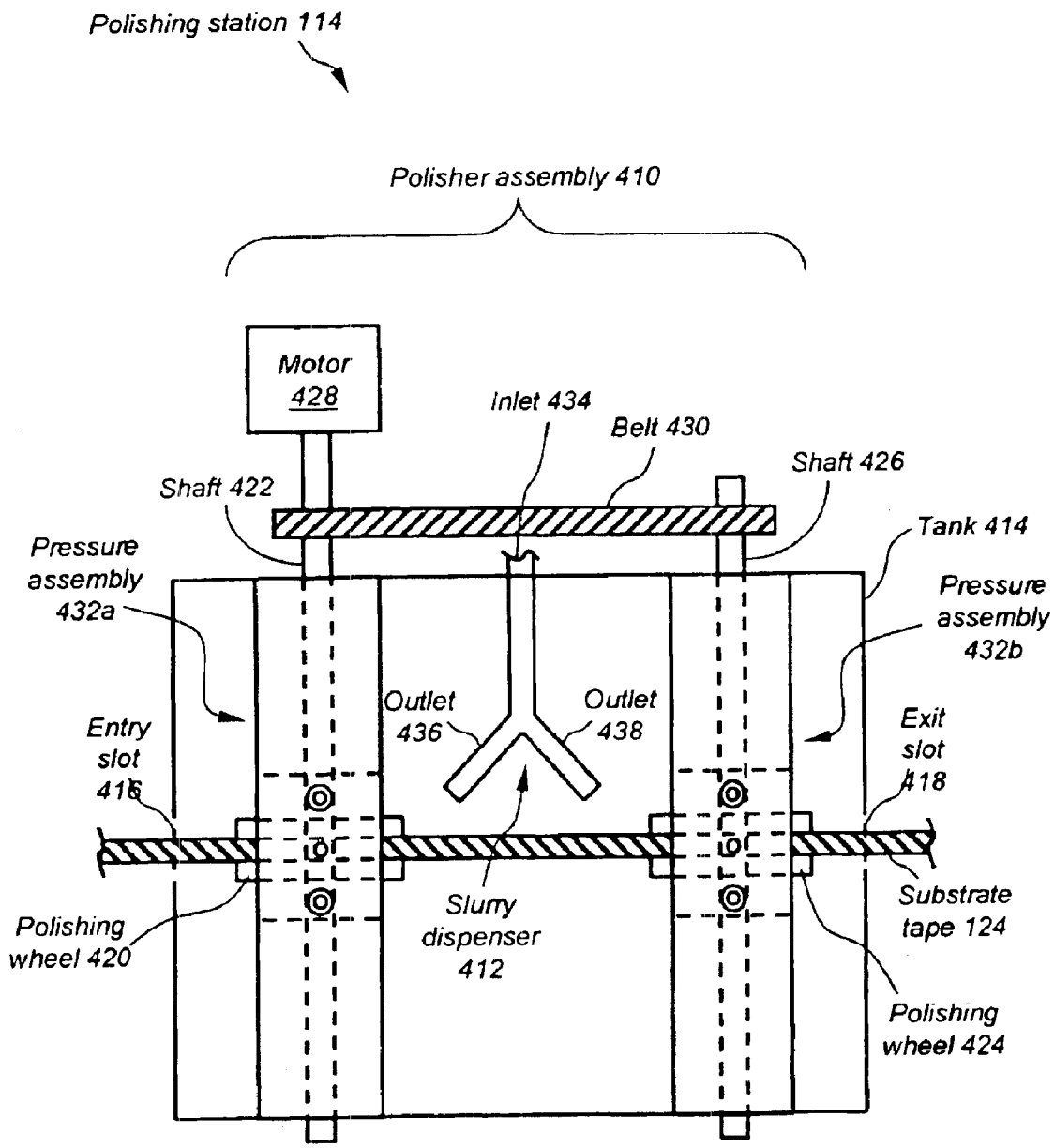
Figure 4C:
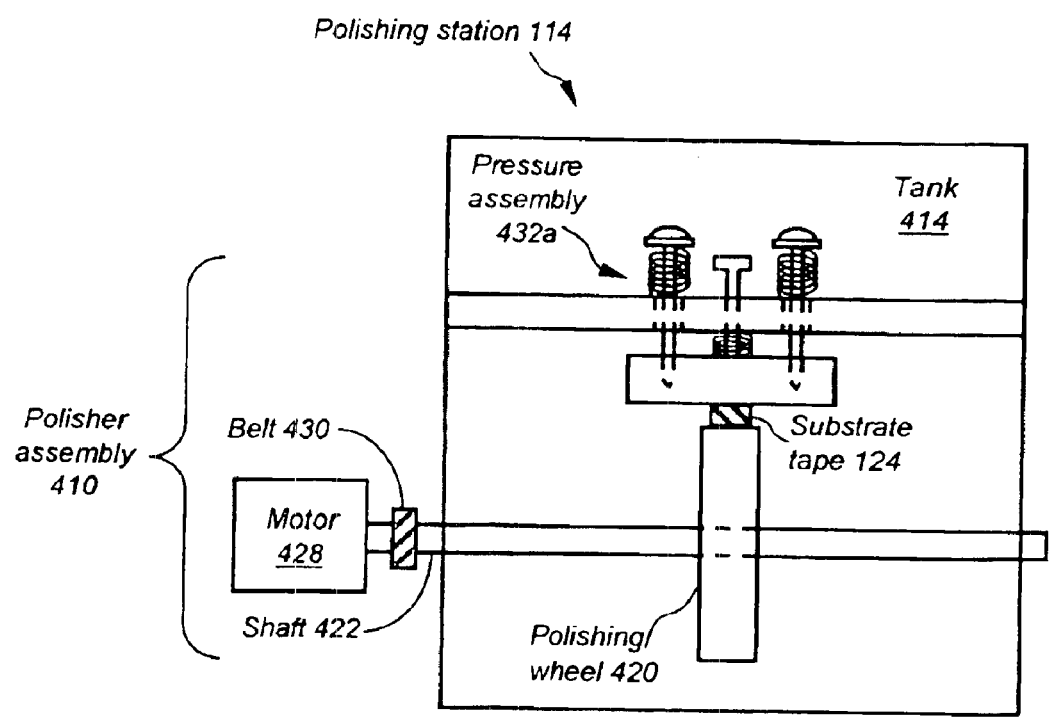

FIGS. 4A, 4B and 4C illustrate a side view, a top view, and an end view, respectively, of the polishing station 114 that is a mechanical polisher suitable for use within the polishing system 100 of the present invention.

The polishing station 114 includes a polisher assembly 410 and a slurry dispenser 412 disposed within a tank 414 formed of stainless steel. The tank 414 has an entry slot 416 and an exit slot 418 through which the substrate tape 124 may translate. Inserted in the entry slot 416 and the exit slot 418 is a squeegee (not shown) formed, e.g. of silicon rubber and felt for removing excess slurry from the substrate tape 124 as it passes therethrough.

The polisher assembly 410 includes a polishing wheel 420 mounted on a rotatable shaft 422 whose ends pass through opposing walls of the tank 414 leaving the polishing wheel 420 suspended within the tank 414. Similarly, the polisher assembly 410 includes a polishing wheel 424 mounted on a rotatable shaft 426 whose ends pass through opposing walls of the tank 414 leaving the polishing wheel 424 suspended within the tank 414. When installed, the polishing wheel 420 and the polishing wheel 424 of the polisher assembly 410 are aligned along the axis of the substrate tape 124 passing through the tank 414. Additionally, the polishing wheel 420 and the polishing wheel 424 of the polisher assembly 410 are aligned on a horizontal plane such that they make contact with the polished surface 128 of the substrate tape 124.

The polishing wheel 420 and the polishing wheel 424 are, for example, four inches in diameter. The polishing wheel 420 and the polishing wheel 424 are diamond hard felt polishing wheels, such as manufactured by Boston Felt, with a "Shore A hardness" above 85 or a functionally equivalent material. Alternatively, the polishing wheel 420 and the polishing wheel 424 are hard felt polishing wheels formed by pure felt, such as manufactured by Boston Felt, with a "Shore A hardness" in the range of 30 to 85 depending on which polishing station they are operating within, i.e., the polishing station 114a, 114b, 114c, or 118. Shore hardness is a well-known measure of the resistance of a material to indentation by a spring-loaded indenter. The Shore hardness scale is a raw number between 0 and 100 with no units, the higher the number, the greater the resistance, i.e. the harder the material. Materials with appropriate Shore hardness may be substituted.

A conventional motor 428 rotatably drives the shaft 422 and subsequently the polishing wheel 420. The motor 428 additionally drives the shaft 426 and subsequently the polishing wheel 424 via a belt 430 that couples the rotational motion of the shaft 422 to the shaft 426 via pulleys (not shown). The motor 428 is, for example, a conventional 0.5 hp motor, such as a Dayton 5K984D motor, that is capable of a rotational speed of up to 1600 rpm. FIG. 4B illustrates but one example driving mechanism, those skilled in the art will appreciate that the shaft 422 and the shaft 426 may be rotatably driven by other conventional means.

The polisher assembly 410 further includes multiple instantiations of a pressure assembly 432, for example a pressure assembly 432a associated with the polishing wheel 420 and a pressure assembly 432b associated with the polishing wheel 424. In operation, the substrate tape 124 is sandwiched between the pressure assembly 432a and the polishing wheel 420, and between the pressure assembly 432b and the polishing wheel 424. As a result, the pressure assembly 432a and the pressure assembly 432b apply pressure onto the non-polished surface 126 of the substrate tape 124 that in turn transfers pressure to the polished surface 128 of the substrate tape 124 against the polishing wheel 420 and the polishing wheel 424, respectively. The pressure assembly 432 is described in detail in FIG. 5.

The slurry dispenser 412 further includes an inlet 434 feeding a first outlet 436 and a second outlet 438. The inlet 434 enters through the wall of the tank 414 and feeds the outlet 436 that is directed toward the polishing wheel 420 and the outlet 438 that is directed toward the polishing wheel 424. In operation, a polishing medium, in the form of a slurry, is pumped (pump not shown) into the tank 414 with a controlled flow rate of, for example, 60 ml per minute via the slurry dispenser 412. The pump is typically capable of providing a flow rate of between 17 ml to 17 liters per minute. The polishing medium is subsequently dispensed onto the polishing wheel 420 and the polishing wheel 424 via the outlet 436 and the outlet 438, respectively. The polishing medium is, for example, a slurry formed of one part aluminum oxide powder mixed with fifteen parts water. The particle size of the aluminum oxide powder is in the range of 1.0 to 0.05 microns depending on the polishing station location, i.e., the polishing station 114a, 114b, or 114c. Finally, an outlet 440 disposed in the bottom of the tank 414 provides an outlet for recirculating the polishing medium.

Figure 5:
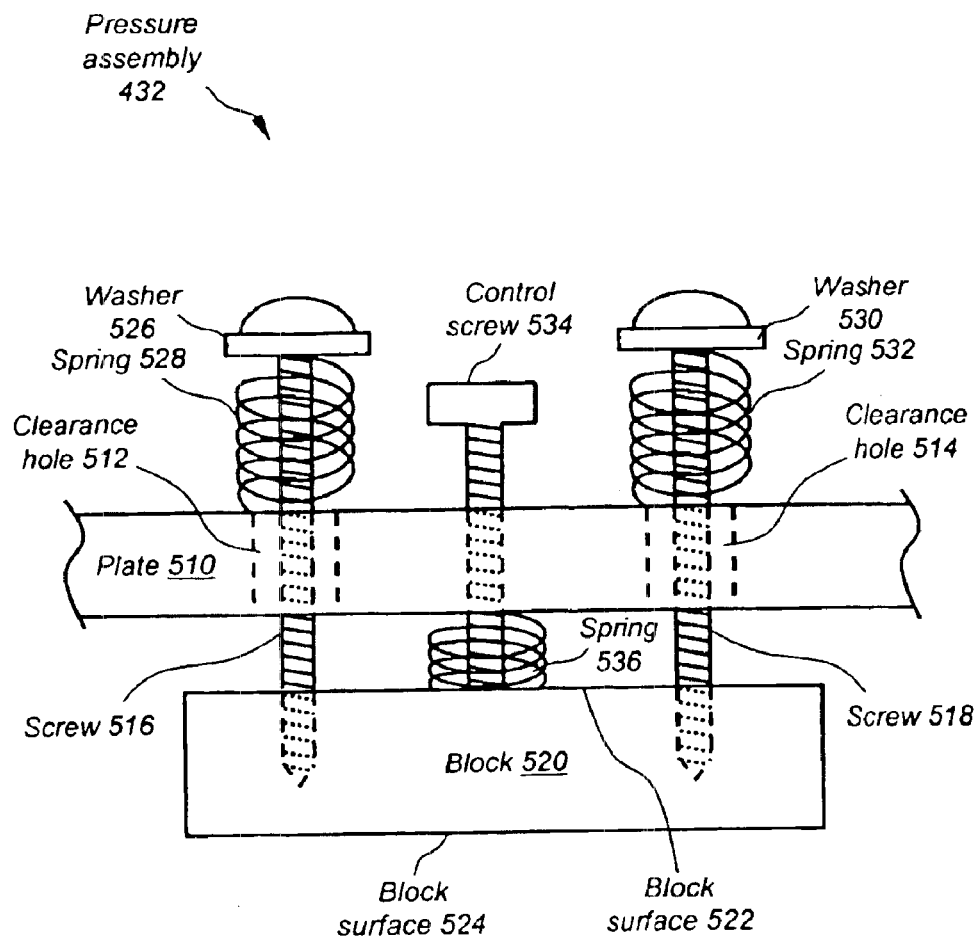
FIG. 5 illustrates a side view of a pressure device suitable for use within the polishing station illustrated in FIGS. 4A, 4B and 4C.

FIG. 5 illustrates a side view of the pressure assembly 432 that is a pressure device suitable for use within the polishing station 114 illustrated in FIGS. 4A, 4B and 4C. The pressure assembly 432 includes a stainless steel plate 510 whose ends, when installed, is connected to opposing walls of, for example, the tank 414 of the polishing station 114. The thickness of the plate 510 is such that negligible deflection of the plate 510 occurs when the pressure assembly 432 is under load. The plate 510 has a first clearance hole 512 and a second clearance hole 514 through which passes a first screw 516 and a second screw 518, respectively. The diameter of the clearance hole 512 and the clearance hole 514 is sufficiently large to allow the screw 516 and the screw 518 to freely float as they pass through the plate 510. The screw 516 and the screw 518 are conventional screws, such as a 2 inch 10–32 screw, that provide mechanical coupling to a block 520 by threading through a first block surface 522 of the block 520, which is the surface of the block 520 that is oriented toward the plate 510. A second block surface 524 of the block 520 is oriented toward the substrate tape 124 upon which it contacts when installed. The block 520 is formed of a low friction material, such as Teflon, that is not damaging to the non-polished surface 126 of the substrate tape 124. The dimensions of the block 520 are, for example, 2 inches wide by 2.75 inches long by 1 inch thick. Fitting flush against the head of the screw 516 is a standard washer 526. Furthermore, a spring 528 is arranged between the washer 526 and the plate 510. Similarly, fitting flush against the head of the screw 518 is a standard washer 530 and a spring 532 is arranged between the washer 530 and the plate 510. The spring 528 and the spring 532 are conventional springs having a maximum spring force of, for example, 2205 lbs and that have a large enough inside diameter to allow the screw 516 and the screw 518 to pass. Lastly, a control screw 534 is disposed between the screw 516 and the screw 518 and threaded entirely through the plate 510. Having passed through the plate 510 the threaded end of the control screw 534 subsequently passes through a spring 536 disposed between the plate 510 and the block surface 522 of the block 520 and then comes into contact with the block surface 522 of the block 520, as shown in FIG. 5. The control screw 534 is conventional machine screw, such as a ⅜ inch 6–32 screw that is 1.5 inches long. The spring 536 is a conventional spring having a maximum spring force of, for example, 2205 lbs and has a large enough inside diameter to allow the control screw 534 to pass.

With continuing reference to FIG. 5, the block 520 is essentially suspended from the plate 510 via the screw 516 and the screw 518 that are allowed to freely float as they pass through the plate 510. The spring 528 and the spring 532 provide upward force against the washer 526 and the washer 530, respectively, thereby creating a pulling action to draw the block 520 toward the plate 510, where the plate 510 provides a stationary mechanical reference within the tank 414 of the polishing station 114. In its relaxed state (i.e., the control screw 534 in a retracted position) the spring 536 prevents the block surface 522 of the block 520 from coming into contact with the plate 510. However, when the control screw 534 is adjusted such that its threaded end is in contact with the block surface 522 of the block 520 it provides an opposing force to the spring 528 and the spring 532, thereby forcing the block 520 to be pushed away from the plate 510 and into contact with the non-polished surface 126 of the substrate tape 124. The pressure assembly 432 is capable of a maximum pressure of 1000 lbs per square inch but is typically set within a range of 0 to 300 lbs per square inch. A load sensor (not shown) is disposed within the center of the block 520 and is connected through a cable (not shown) to an external readout display so that the pressure exerted by the pressure assembly 432 upon the substrate tape 124 may be monitored. The load sensor is, for example, a simple button sensor, such as Sensotec Model 53 AL131.

Figure 6A:
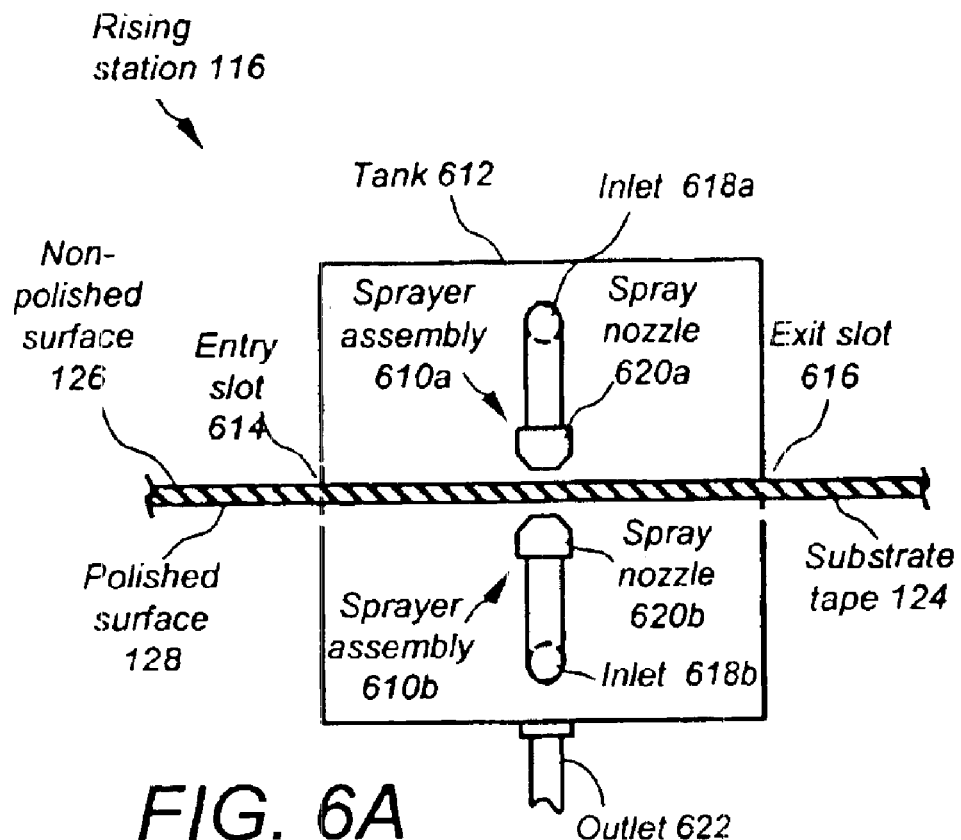
FIGS. 6A and 6B illustrate a side view and an end view, respectively, of a substrate tape cleaning mechanism suitable for use as a rinsing station within the polishing system of the present invention.
Figure 6B:
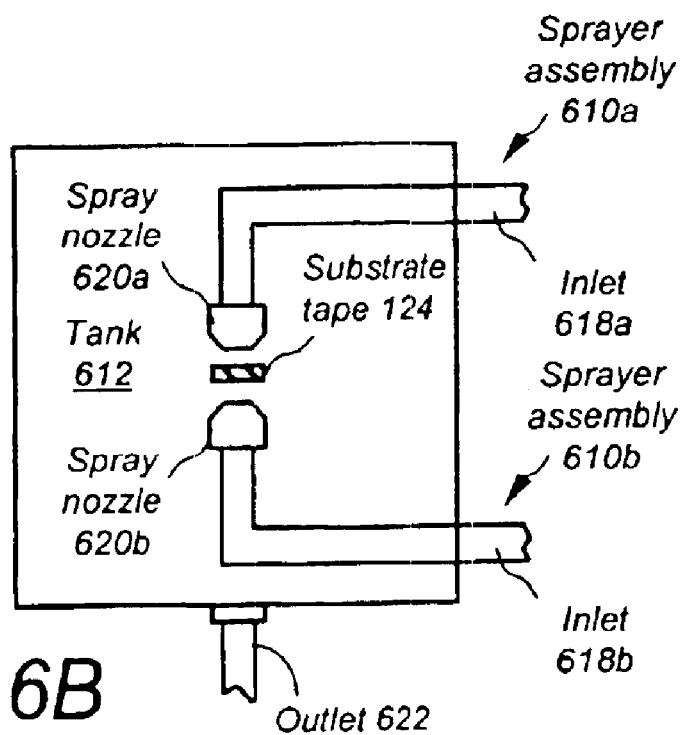

FIGS. 6A and 6B illustrate a side view and an end view, respectively, of the rinsing station 116 that is a substrate tape cleaning mechanism suitable for use within the polishing system 100 of the present invention.

The rinsing station 116 includes multiple instantiations of a sprayer assembly 610, for example a sprayer assembly 610*a* and a sprayer assembly 610*b*, disposed within a tank 612 formed of stainless steel. The tank 612 has an entry slot 614 and an exit slot 616 through which the substrate tape 124 may translate. Inserted in the entry slot 614 and the exit slot 616 is a squeegee (not shown) formed of felt for removing excess water from the substrate tape 124 as it passes therethrough.

Each sprayer assembly 610 includes an inlet 618 feeding a conventional spray nozzle 620. More specifically, the sprayer assembly 610*a* includes an inlet 618*a* feeding a spray nozzle 620*a* and the sprayer assembly 610*b* includes an inlet 618*b* feeding a spray nozzle 620*b*. The inlet 618*a* and the inlet 618*b* pass through the wall of the tank 612 and are connected to a source of rinsing water, such as tap water or de-ionized water, having a pressure that is typically less than 75 psi. The sprayer assembly 610*a* and the sprayer assembly 610*b* are oriented 180 degrees to one another within the tank 612 such that the spray nozzle 620*a* and the spray nozzle 620*b* are facing one another and are sufficiently spaced to allow the substrate tape 124 to pass between, as shown in FIG. 6B. In operation, the rinsing water is released into the tank 612 via the sprayer assembly 610*a* and the sprayer assembly 610*b* and directed onto the substrate tape 124 for the purpose of rinsing the polishing medium residue from the surfaces of the substrate tape 124. Finally, an outlet 622 disposed in the bottom of the tank 612 provides a drain for expelling the rinsing water.

Figure 7:
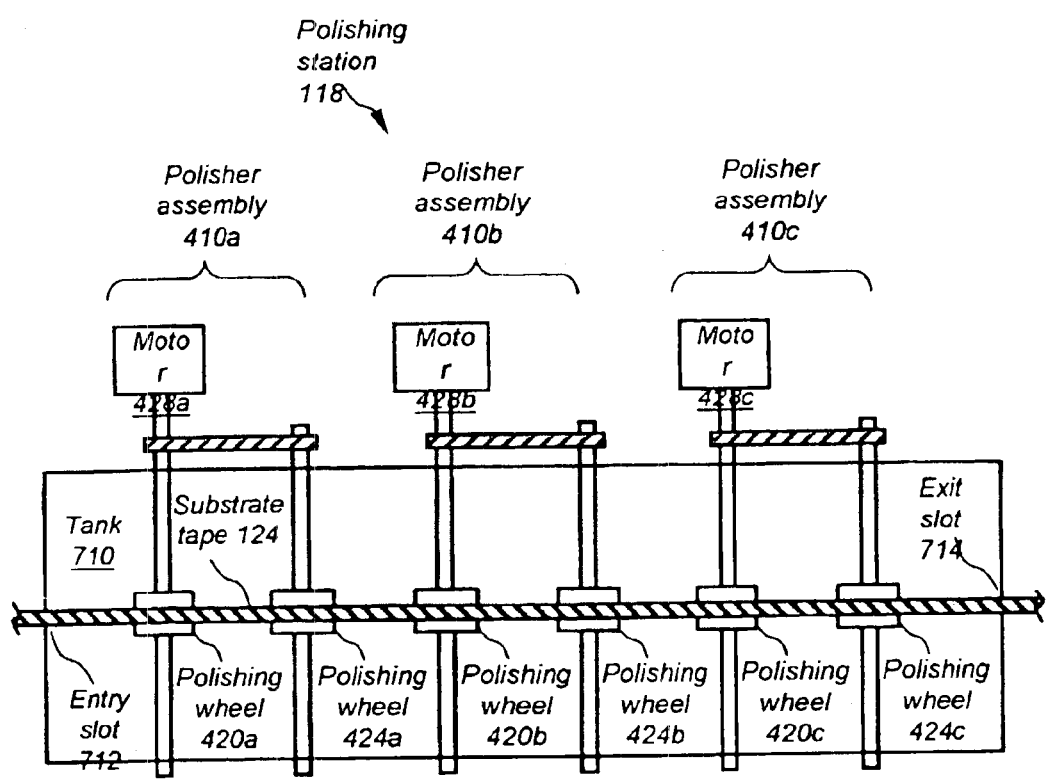
FIG. 7 illustrates a top view of a mechanical polisher suitable for use as the final polishing station within the polishing system of the present invention.

FIG. 7 illustrates a top view of the polishing station 118 that is a mechanical polisher suitable for use within the polishing system 100 of the present invention.

The polishing station 118 includes multiple instantiations of the polisher assembly 410 as described in FIG. 4. For example, the polishing station 118 includes a polisher assembly 410*a* having a polishing wheel 420*a* and a polishing wheel 424*a* driven by a motor 428*a*, a polisher assembly 410*b* having a polishing wheel 420*b* and a polishing wheel 424*b* driven by a motor 428*b*, and a polisher assembly 410*c* having a polishing wheel 420*c* and a polishing wheel 424*c* driven by a motor 428*c*. For simplicity of illustration, the pressure assembly 432 associated with each polishing wheel is not shown in FIG. 7.

FIG. 7 illustrates but one example driving mechanism, those skilled in the art will appreciate that the multiple polishing wheels may be rotatably driven by other conventional means, for example, by a single motor 428 with multiple belts.

The polisher assembly 410*a*, the polisher assembly 410*b*, and the polisher assembly 410*c* are disposed within a tank 710 formed of stainless steel. The tank 710 has an entry slot 712 and an exit slot 714 through which the substrate tape 124 may translate. Inserted in the entry slot 712 and the exit slot 714 is a squeegee (not shown) formed of silicon rubber and felt for removing excess slurry from the substrate tape 124 as it passes therethrough.

When installed, the polishing wheel 420*a* and the polishing wheel 424*a* of the polisher assembly 410*a*, the polishing wheel 420*b* and the polishing wheel 424*b* of the polisher assembly 410b, the polishing wheel 420c and the polishing wheel 424c of the polisher assembly 410c, are all aligned along the axis of the substrate tape 124 passing through the tank 710. Additionally, all polishing wheels are aligned on a horizontal plane such that they make contact with the polished surface 128 of the substrate tape 124.

The polishing station 118 further includes multiple instantiations of the slurry dispenser 412 for directing the polishing medium onto the polishing wheels as described in FIG. 4. However, for simplicity of illustration, the multiple instantiations of the slurry dispenser 412 are not shown in FIG. 7. Likewise, it can be assumed that the tank 710 has on or more outlets for recirculating the polishing medium as described in FIG. 4. Again, for simplicity of illustration, the outlets are not shown in FIG. 7.

Figure 8A:
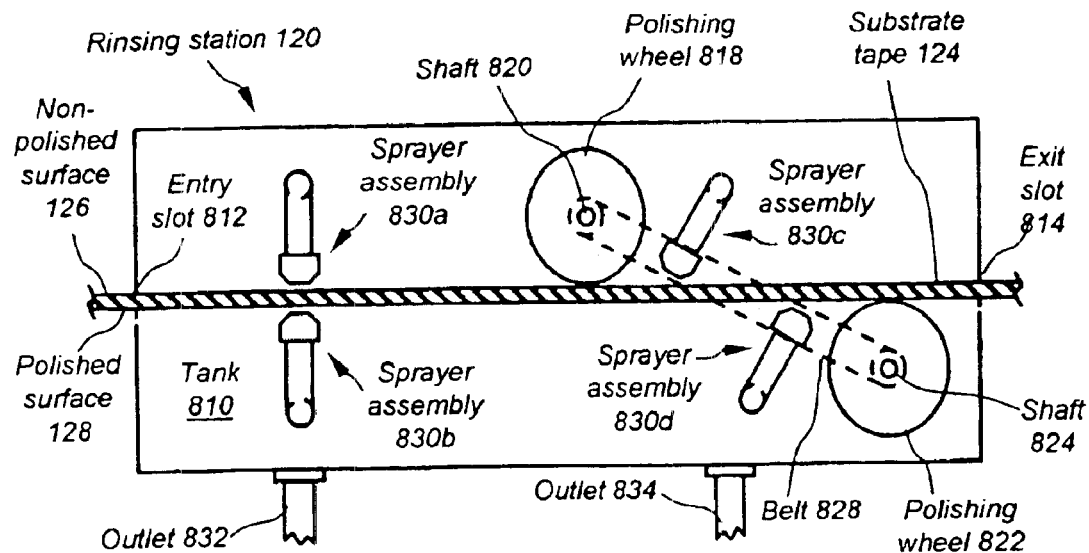
FIGS. 8A and 8B illustrate a side view and a top view, respectively, of a substrate tape cleaning mechanism suitable for use as the final rinsing station within the polishing system of the present invention.
Figure 8B:
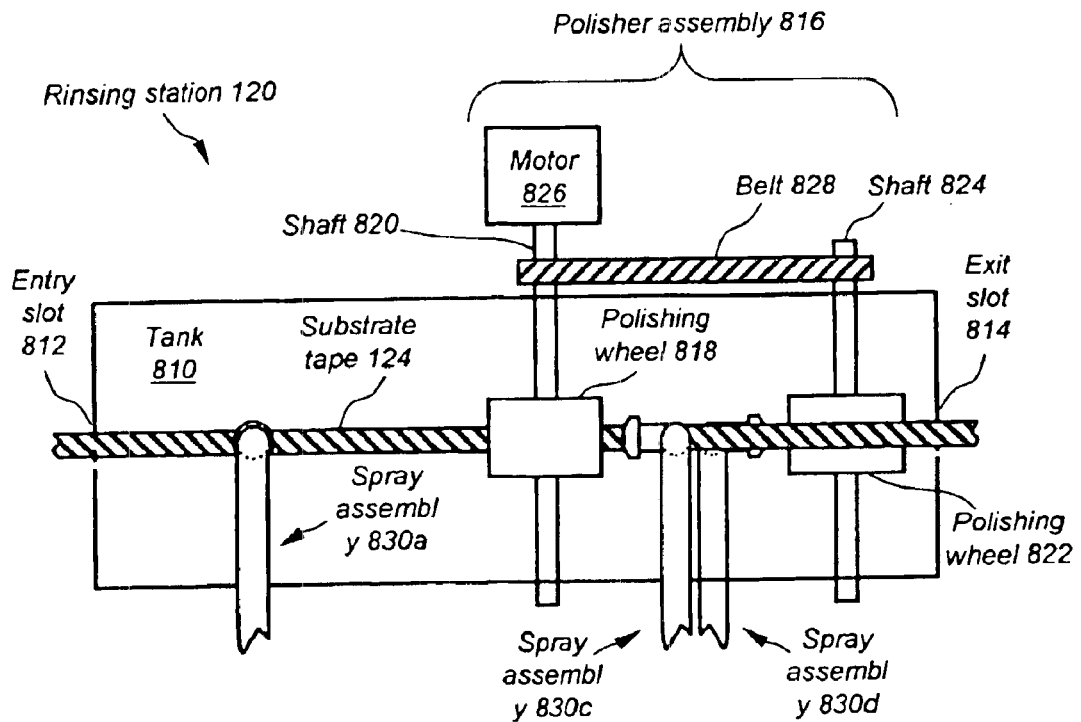

FIGS. 8A and 8B illustrate a side view and a top view, respectively, of the rinsing station 120 that is a substrate tape cleaning mechanism suitable for use within the polishing system 100 of the present invention.

The rinsing station 120 includes a tank 810 formed of stainless steel and having an entry slot 812 and an exit slot 814 through which the substrate tape 124 may translate. Inserted in the entry slot 812 and the exit slot 814 is a squeegee (not shown) formed of silicon rubber and felt for removing excess water from the substrate tape 124 as it passes therethrough. Disposed within tank 810 is a polisher assembly 816 in combination with multiple instantiations of a sprayer assembly 830 that is identical to the sprayer assembly 610 having an inlet and a spray nozzle as described in FIGS. 6A and 6B. For example, the rinsing station 120 includes a sprayer assembly 830a, a sprayer assembly 830b, a sprayer assembly 830c, and a sprayer assembly 830d.

The polisher assembly 816 includes a polishing wheel 818 mounted on a rotatable shaft 820 whose ends pass through opposing walls of the tank 810 leaving the polishing wheel 818 suspended within the tank 810. Similarly, the polisher assembly 816 includes a polishing wheel 822 mounted on a rotatable shaft 824 whose ends pass through opposing walls of the tank 810 leaving the polishing wheel 824 suspended within the tank 810. When installed, the polishing wheel 818 and the polishing wheel 822 of the polisher assembly 816 are aligned along the axis of the substrate tape 124 passing through the tank 810. However, the polishing wheel 818 and the polishing wheel 822 of the polisher assembly 816 are not arranged on the same horizontal plane within the tank 810. Instead, the polishing wheel 818 and the polishing wheel 822 are arranged on opposing sides of the substrate tape 124. More specifically, the polishing wheel 818 makes contact when installed with the non-polished surface 126 of the substrate tape 124 and the polishing wheel 822 makes contact when installed with the polished surface 128 of the substrate tape 124, as shown in FIG. 8A.

The polishing wheel 818 and the polishing wheel 822 are soft polishing wheels, such as a Boston Felt soft wheel with a "Shore A hardness" in the range of 30 to 40. A conventional motor 826 rotatably drives the shaft 820 and subsequently the polishing wheel 818. The motor 826 additionally drives the shaft 824 and subsequently the polishing wheel 822 via a belt 828 that couples the rotational motion of the shaft 820 to the shaft 824 via pulleys (not shown). The motor 826 is, for example, a conventional 0.5 hp motor, such as Dayton 5K984D motor, that is capable of a rotational speed of up to 1600 rpm. FIG. 8B illustrates but one example driving mechanism, those skilled in the art will appreciate that the shaft 820 to the shaft 824 may be rotatably driven by other conventional means.

Unlike the polisher assembly 410 described in FIGS. 4A, 4B and 4C, the polisher assembly 816 does not include any instantiations of the pressure assembly 432 that is described in FIG. 5.

The inlet of each sprayer assembly 830 passes through the wall of the tank 810 and feeds its associated spray nozzle, where each inlet is connected to a source of rinsing water, such as tap water or de-ionized water, having a pressure that is typically less than 75 psi. The sprayer assembly 830a and the sprayer assembly 830b are oriented 180 degrees to one another within the tank 810 such that their spray nozzles are facing one another and are sufficiently spaced to allow the substrate tape 124 to pass between, as shown in FIG. 8A. The sprayer assembly 830c is oriented at an angle directing its spray nozzle toward the contact point of the polishing wheel 818 and the non-polished surface 126 of the substrate tape 124. Likewise, the sprayer assembly 830d is oriented at an angle directing its spray nozzle toward the contact point of the polishing wheel 822 and the polished surface 128 of the substrate tape 124, as shown in FIG. 8A.

In operation, the rinsing water is released into the tank 810 via the sprayer assembly 830a, the sprayer assembly 830b, the sprayer assembly 830c, and the sprayer assembly 830d and directed onto the substrate tape 124 for the purpose of rinsing the polishing medium residue from the surfaces of the substrate tape 124. Finally, an outlet 832 and an outlet 834 disposed in the bottom of the tank 810 provide a drain for expelling the rinsing water.

In operation, and with reference to FIG. 1, the polishing wheels in the polishing station 114a, the polishing station 114b, the polishing station 114c, the polishing station 118, and the rinsing station 120, are selected having a hardness according to Table 1 below and installed. Additionally, the particle size of the polishing medium within the slurry feeding the polishing station 114a, the polishing station 114b, the polishing station 114c, and the polishing station 118 is selected according to Table 1 below.

TABLE 1

Polishing wheel hardness and polishing medium particle size as required for the polishing system 100

| | Polishing wheel Shore A hardness | | Polishing medium particle size | |
|---|---|---|---|---|
| | Acceptable range | Specific example | Acceptable range | Specific example |
| Polishing station 114a | Above 85 | Diamond Hard | 0.3 to 1.0 microns | 1.0 microns |
| Polishing station 114b | 55 to 65 | Hard | 0.05 to 0.3 microns | 0.3 microns |
| Polishing station 114c | 55 to 65 | Hard | 0.05 to 0.3 microns | 0.3 microns |
| Polishing station 118 | 55 to 65 | Hard | ≦0.05 microns | 0.05 microns |
| Rinsing station 120 | 30 to 40 | Soft | n/a | n/a |

With continuing reference to FIGS. 1 through 8B, the operation of the polishing system 100 is described as follows. The reel 210 of the spool 110a that has a length of substrate tape 124 wound upon it is mounted at the front end of the polishing system 100. The leader of the substrate tape 124 is laced through the tape feeder 112 between the belt 312 and the belt 320 (FIGS. 3A, 3B and 3C), all the while the substrate tape 124 is riding on the guide wheel 130. The leader of the substrate tape 124 is then laced through the polishing station 114a via its entry slot 416 and subsequently through its polisher assembly 410 and finally through its exit slot 418. The leader of the substrate tape 124 is then laced through the rinsing station 116a via its entry slot 614 and subsequently passing in close proximity to multiple instantiations of the of the sprayer assembly 610 and finally through its exit slot 616. The leader of the substrate tape 124 is then laced through the polishing station 114b via its entry slot 416 and subsequently through its polisher assembly 410 and finally through its exit slot 418. The leader of the substrate tape 124 is then laced through the rinsing station 116b via its entry slot 614 and subsequently passing in close proximity to multiple instantiations of the of the sprayer assembly 610 and finally through its exit slot 616. The leader of the substrate tape 124 is then laced through the polishing station 114c via its entry slot 416 and subsequently through its polisher assembly 410 and finally through its exit slot 418. The leader of the substrate tape 124 is then laced through the rinsing station 116c via its entry slot 614 and subsequently passing in close proximity to multiple instantiations of the of the sprayer assembly 610 and finally through its exit slot 616. The leader of the substrate tape 124 is then laced through the polishing station 118 via its entry slot 712 and subsequently through its multiple instantiations of the polisher assembly 410 and finally through its exit slot 714. The leader of the substrate tape 124 is then laced through the rinsing station 120 via its entry slot 812 and subsequently passing in close proximity to multiple instantiations of the of the sprayer assembly 830 and through its polisher assembly 816 and finally through its exit slot 814. Lastly, the leader of the substrate tape 124 is laced onto the spool 110b, all the while the substrate tape 124 is riding on the guide wheel 132 and the tension of the substrate tape 124 is set by adjusting the torque on the motor 212 of the spool 110a and on the motor 212 of the spool 110b. The tension is set to a level sufficient to maintain the flatness of the substrate tape 124 for polishing, yet without stressing the substrate tape 124 to its breaking point.

Having laced the substrate tape 124 through all the elements of the polishing station 100, the water source feeding the rinsing station 116a, the rinsing station 116b, the rinsing station 116c, and the rinsing station 120 is activated. Additionally, the slurry pumps (not shown) feeding the slurry dispenser 412 of the polishing station 114a, the slurry dispenser 412 of the polishing station 114b, and the slurry dispenser 412 of the polishing station 114c are activated and all flow rates are adjusted via the pump controls. Likewise, the slurry pump feeding the multiple instantiations of the slurry dispenser 412 of the polishing station 118 is activated and the flow rate is adjusted via the pump control. In all cases, the flow rate is set such that an optimal supply of polishing medium is present at the polishing wheels to achieve the desired result.

Having begun the flow of rinsing water and polishing medium, all motors within the polishing system 100 are activated. More specifically, the motor 428 of the polishing station 114a is activated, the motor 428 of the polishing station 114b is activated, the motor 428 of the polishing station 114c is activated, and the multiple instantiations of the motor 428 of the polishing station 118 are activated. Additionally, the motor 212 of the spool 110a and the motor 212 of the spool 110b are activated. Lastly, the motor 328 of the tape feeder 112 is activated. The pressure exerted on the substrate tape 124 by the belt 312 and the belt 320 of the tape feeder 112 creates sufficient friction to cause the substrate tape 124 to translate through the polishing system 100 due to the rotation of the belts 312 and 320 of the tape feeder 112. The translation speed of the substrate tape 124 is set by adjusting the speed of the tape feeder 112 to provide a controlled rate of translation to allow the proper exposure time of the substrate tape 124 to the various polishing and cleaning events. The translation rate can vary in a range of from about 0.1 to about 1.5 cm/min; preferably form about 0.15 to about 0.5 cm/min. A typical translation rate is, for example, 0.2 to about 0.4 cm/min.

Subsequently, the pressure of the substrate tape 124 against the polishing wheels disposed throughout the polishing system 100 is set by adjusting the control screw 534 of each instantiation of the pressure assembly 432 within the polishing station 114a, by adjusting the control screw 534 of each instantiation of the pressure assembly 432 within the polishing station 114b, by adjusting the control screw 534 of each instantiation of the pressure assembly 432 within the polishing station 114c, and by adjusting the control screw 534 of each instantiation of the pressure assembly 432 within the polishing station 118. In all cases, the pressure is set within a range of 0 to 300 lbs per square inch by monitored the pressure via the load sensor that is built into each block 520.

Subsequently, the roughness monitor 122 is activated and its position is manually adjusted via the 3-axis adjustable stage such that the distance between the substrate tape 124 and the roughness monitor 122 is appropriate for measuring roughness to the required accuracy. Having begun the flow of rinsing water and polishing medium, and having activated all motors, the substrate tape 124 is now translating through the polishing system 100 and experiencing multiple polishing and rinsing events in succession. More specifically, the substrate tape 124 experiences the first polishing and rinsing event via the polishing station 114a and the rinsing station 116a. The polishing wheel hardness and polishing medium particle size is as shown in Table 1, and thus this first polishing event is considered the most aggressive polishing event within the polishing system 100.

Next, the substrate tape 124 experiences a series or more moderate polishing events and subsequent rinsing events by passing through the polishing station 114b and the rinsing station 116b, then through the polishing station 114c and the rinsing station 116c, and then through the polishing station 118. The polishing wheel hardness and polishing medium particle size for the polishing station 114b, the polishing station 114c, and the polishing station 118 is as shown in Table 1, and thus these polishing events are considered less aggressive than that of the polishing station 114a.

Lastly, the substrate tape 124 experiences a final polishing and rinsing event via the rinsing station 120 that provides the function of both rinsing and polishing, but without the presence of a polishing medium. The polishing wheel hardness is as shown in Table 1, and thus this polishing event is considered the least aggressive polishing event within the polishing system 100 and applies the most fine and smooth surface quality to the polished surface 128 of the substrate tape 124.

In this way, the substrate tape 124 experiences, via progressive stages, first a rough, then a medium, then a fine polishing event in combination with a respective rinsing event as it translates through the polishing system 100, thereby achieving in a single pass through the polishing system 100 a surface smoothness that is suitable for the subsequent deposition of a buffer layer.

It is noted that the polishing wheel hardness and polishing medium particle size is not limited to that as shown in Table 1, other combinations are possible depending on the product application.

Figure 9:
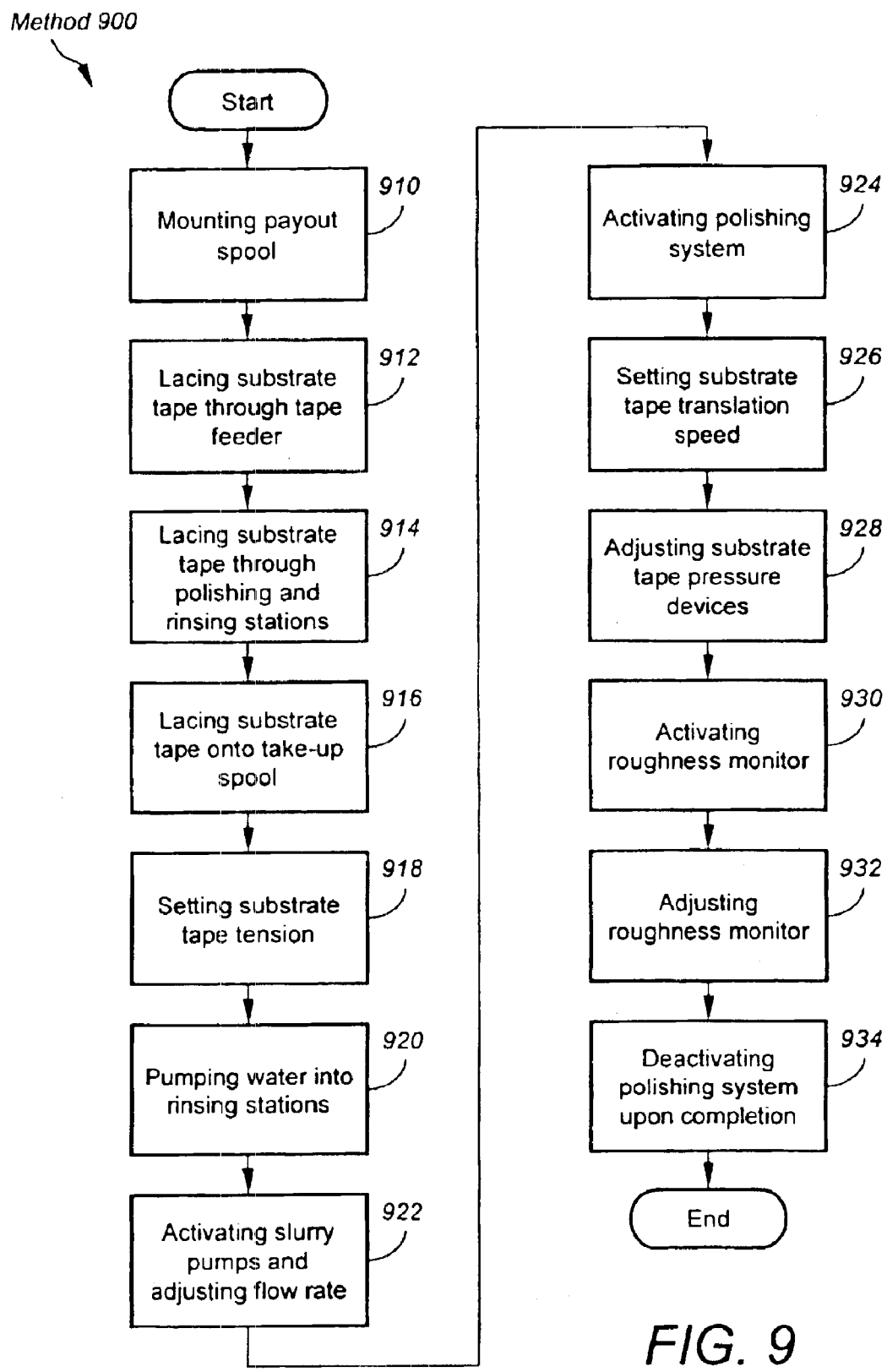
FIG. 9 is a flow diagram illustrating a method of operation of the polishing system of the present invention.

FIG. 9 illustrates a method 900 in accordance with the invention of operating the polishing system 100 that is a mechanical polishing system suitable for polishing long lengths of metal substrate tape used in the manufacture of HTS-coated tape. The method 900 includes the steps of:

Step 910: Mounting Payout Spool

In this step, the user mounts the reel 210 of the spool 110a within the polishing system 100. The reel 210 has a length of substrate tape 124 wound upon it. Method 900 proceeds to step 912.

Step 912: Lacing Substrate Tape through Tape Feeder

In this step, the user laces the leader of the substrate tape 124 through the tape feeder 112 between the belt 312 and the belt 320 of the tape feeder 112 (FIGS. 3A, 3B and 3C), all the while the substrate tape 124 is riding on the guide wheel 130. Method 900 proceeds to step 914.

Step 914: Lacing Substrate Tape Through Polishing and Rinsing Stations

In this step, the user laces the leader of the substrate tape 124 through the polishing station 114a via its entry slot 416 and subsequently through its polisher assembly 410 and finally through its exit slot 418. The user then laces the leader of the substrate tape 124 through the rinsing station 116a via its entry slot 614 and subsequently passing in close proximity to multiple instantiations of the of the sprayer assembly 610 and finally through its exit slot 616. The user then laces the leader of the substrate tape 124 through the polishing station 114b via its entry slot 416 and subsequently through its polisher assembly 410 and finally through its exit slot 418. The user then laces the leader of the substrate tape 124 through the rinsing station 116b via its entry slot 614 and subsequently passing in close proximity to multiple instantiations of the of the sprayer assembly 610 and finally through its exit slot 616. The user then laces the leader of the substrate tape 124 through the polishing station 114c via its entry slot 416 and subsequently through its polisher assembly 410 and finally through its exit slot 418. The user then laces the leader of the substrate tape 124 through the rinsing station 116c via its entry slot 614 and subsequently passing in close proximity to multiple instantiations of the of the sprayer assembly 610 and finally through its exit slot 616. The user then laces the leader of the substrate tape 124 through the polishing station 118 via its entry slot 712 and subsequently through its multiple instantiations of the polisher assembly 410 and finally through its exit slot 714. The user then laces the leader of the substrate tape 124 through the rinsing station 120 via its entry slot 812 and subsequently passing in close proximity to multiple instantiations of the of the sprayer assembly 830 and through its polisher assembly 816 and finally through its exit slot 814. Method 900 proceeds to step 916.

Step 916: Lacing Substrate Tape Onto Take-Up Spool

In this step, the user laces the leader of the substrate tape 124 onto the spool 110b, all the while the substrate tape 124 is riding on the guide wheel 132. Method 900 proceeds to step 918.

Step 918: Setting Substrate Tape Tension

In this step, the user sets the tension of the substrate tape 124 by adjusting the torque on the payout spool and take-up spool motors. More specifically, by adjusting the torque on the motor 212 of the spool 110a and on the motor 212 of the spool 110b. The tension is set to a level sufficient to maintain the flatness of the substrate tape 124 for polishing, yet without stressing the substrate tape 124 to its breaking point. Method 900 proceeds to step 920.

Step 920: Pumping Water into Rinsing Stations

In this step, the user activates the water source feeding the rinsing station 116a, the rinsing station 116b, the rinsing station 116c, and the rinsing station 120. Method 900 proceeds to step 922.

Step 922: Activating Slurry Pumps and Adjusting Flow Rate

In this step, the user activates the slurry pump feeding the slurry dispenser 412 of the polishing station 114a and adjusts the flow rate via the pump controls. Subsequently, the user activates the slurry pump feeding the slurry dispenser 412 of the polishing station 114b and adjusts the flow rate via the pump controls. Subsequently, the user activates the slurry pump feeding the slurry dispenser 412 of the polishing station 114c and adjusts the flow rate via the pump controls. Subsequently, the user activates the slurry pump feeding the multiple instantiations of the slurry dispenser 412 of the polishing station 118 and adjusts the flow rate via the pump controls. In all cases, the flow rate is set such that an optimal supply of polishing medium is present at the polishing wheels to achieve the desired result. Method 900 proceeds to step 924.

Step 924: Activating Polishing System

In this step, the user activates the motor 428 of the polishing station 114a, the motor 428 of the polishing station 114b, the motor 428 of the polishing station 114c, and the multiple instantiations of the motor 428 of the polishing station 118. Additionally, the user activates the motor 212 of the spool 110a and the motor 212 of the spool 110b. Lastly, the user activates the motor 328 of the tape feeder 112. Method 900 proceeds to step 926.

Step 926: Setting Substrate Tape Translation Speed

In this step, the user sets the translation speed of the substrate tape 124 by adjusting the speed of the tape feeder 112 to provide a controlled rate of translation to allow the proper exposure time of the substrate tape 124 to the polishing and cleaning events. A typical translation rate is, for example, 1.0 inch per 7 minutes. Method 900 proceeds to step 928.

Step 928: Adjusting Substrate Tape Pressure Devices

In this step, the user adjusts the pressure of the substrate tape 124 against the polishing wheels by adjusting the control screw 534 of each instantiation of the pressure assembly 432 within the polishing station 114a, by adjusting the control screw 534 of each instantiation of the pressure assembly 432 within the polishing station 114b, by adjusting the control screw 534 of each instantiation of the pressure assembly 432 within the polishing station 114c, and by adjusting the control screw 534 of each instantiation of the pressure assembly 432 within the polishing station 118. In all cases, the pressure is set within a range of 0 to 300 lbs per square inch by monitoring the pressure via the load sensor that is built into the block 520. A cable connected to the sensor provides readout to an external display to allow monitoring by the user. Method 900 proceeds to step 930.

Step 930: Activating Roughness Monitor

In this step, the user activates the roughness monitor 122. Method 900 proceeds to step 932.

Step 932: Adjusting Roughness Monitor

In this step, the user manually adjusts the position of the roughness monitor 122 via the 3-axis adjustable stage. More specifically, the roughness monitor 122 is adjusted such that the distance between the substrate tape 124 and the roughness monitor 122 is, for example, 1 inch. Method 900 proceeds to step 934.

Step 934: Deactivating Polishing System Upon Completion

In this step, when the entire length of the substrate tape 124 has been exposed to the polishing system 100, the user deactivates all motors, pumps, and water supplies within the polishing system 100 and removes the take-up spool. More specifically, the user removes the reel 210 of the spool 110b that has the full length of the substrate tape 124 wound upon it. Method 900 ends.

What is claimed is:

1. A process for the continuous single pass multistage surface polishing of a metal tape comprising
   a] providing an unpolished metal tape
   b] providing a polishing chamber comprising a multiplicity of surface treatment units, each unit comprising a polishing station and a rinsing station
   c] continuously feeding the unpolished metal tape into the polishing chamber
   d] sequentially passing the metal tape through a series of surface treatment units where each successive surface treatment unit further polishes a surface of the tape with the aid of a slurry polishing medium comprising an abrasive material and water; and
   e] retrieving polished metal tape from the chamber.

2. The process of claim 1 where the tape is provided to the chamber from a feed reel and is retrieved from the chamber by a take-up reel and where the reels are synchronized to maintain a selected tension in the tape as it moves through the polishing chamber 3. The process of claim 1 where the tape is selected from the group consisting of stainless steel, nickel, and nickel alloy tapes.

4. The process of claim 1 where the tape moves through the polishing chamber at a rate in the range of from about 0.2 to about 0.4 cm/min.

5. The process of claim 1 where the tape is moves through the polishing chamber at a rate in the range of from about 0.15 to about 0.5 em/mm.

6. The process of claim 1 where the tape moves through the polishing chamber at a rate in the range of from about 0.1 to about 1.5 em/mm.

7. The process of claim 1 where the slurry polishing medium used to surface treat the tape is a water slurry of aluminum oxide.

8. The process of claim 1 where the ratio of abrasive material to water in the slurry polishing medium is in the range of from about 1:10 to about 1:20.

9. The process of claim 1 where the ratio of abrasive material to water in the slurry polishing medium is in the range of from about 1:14 to about 1:16.

10. The process of claim 1 where the flow rate of slurry polishing medium in the polishing steps is from about 0.017 l/mm to about 17 l/min.

11. The process of claim 1 where the flow rate of slurry polishing medium in the polishing steps is from about 0.05 l/min to about 5 l/min.

12. The process of claim 1 where the flow rate of slurry polishing medium in the polishing steps is from about 0.1 l/mm to about 1 l/min.

13. The process of claim 1 where the abrasive material in the slurry polishing medium in the initial polishing step has a Shore A hardness of above 85 and a particle size in the range of from about 0.3 microns to about 1.0 micron.

14. The process of claim 1 where the abrasive material in the slurry polishing medium in the second polishing step has a Shore A hardness of from about 55 to about 65 and a particle size in the range of from about 0.05 microns to about 0.3 microns.

15. The process of claim 1 where the abrasive material in the slurry polishing medium in the final polishing step has a Shore A hardness of from about 55 to about 65 and a particle size of no more than about 0.05 microns.

16. A reel-to-reel single-pass continuous mechanical polishing system suitable for polishing long lengths of metal substrate tape used in the manufacture of HTS-coated tape comprising multiple instantiations of a polishing station in combination with a subsequent rinsing station arranged along the axis of the metal substrate tape that is continuously translating between a payout spool and a take-up spool whereby the metal substrate tape experiences a series of polishing events utilizing a slurry polishing medium comprising an abrasive material and water and cleaning events to progressively diminish its surface roughness and achieve a surface smoothness that is acceptable for depositing a buffer layer in the manufacture of HTS-coated tape.

* * * * *